United States Patent [19]
Lee et al.

[11] Patent Number: 5,456,206
[45] Date of Patent: Oct. 10, 1995

[54] METHOD FOR TWO-DIMENSIONAL EPITAXIAL GROWTH OF III-V COMPOUND SEMICONDUCTORS

[75] Inventors: Bun Lee, Daejeon; Mee-Young Yoon, Seoul; Jong-Hyeob Baek, Daejeon, all of Rep. of Korea

[73] Assignee: Electronics and Telecommunications Research Institute, Rep. of Korea

[21] Appl. No.: 350,451

[22] Filed: Dec. 7, 1994

[51] Int. Cl.$^6$ .................................................. H01L 21/20
[52] U.S. Cl. ................................................ 117/93; 117/102
[58] Field of Search ................................ 117/89, 90, 93, 117/102, 953, 954

[56] References Cited

U.S. PATENT DOCUMENTS

| 5,270,247 | 12/1993 | Sakuma et al. | 117/89 |
| 5,296,088 | 3/1994 | Kodama et al. | 117/89 |

FOREIGN PATENT DOCUMENTS

| 155289 | 7/1986 | Japan | 117/89 |
| 62513 | 3/1991 | Japan | 117/89 |

OTHER PUBLICATIONS

T. Anan, et al., "Improvement of InP/InGaAs heterointerfaces grown by gas source molecular beam epitaxy," Applied Physics Letters 63 (8), 23 Aug. 1993, pp. 1047–1049.

Primary Examiner—R. Bruce Breneman
Assistant Examiner—Linda J. Fleck
Attorney, Agent, or Firm—Larson and Taylor

[57] ABSTRACT

A method for growing a thin InGaAs or InAlAs layer with heavy lattice mismatching on a GaAs substrate by a MOCVD process is described. A first material gas is injected by a MOCVD process to grow a buffer layer on a GaAs substrate to a prescribed thickness. After stopping the injection of the first material gas for a few seconds, a second material gas containing a column III element is injected at a prescribed temperature. A third material gas containing a column V element is injected to grow, on the buffer layer, a thin metallic layer of a binary compound containing the column III element of a high concentration to a thickness of 2 nm or less. After a prescribed time from the injection of the third material gas, In and Ga gases or In and Al gases, mixed in the prescribed proportion are injected in an atmosphere of said third material gas to grow a thin InGaAs or InAlAs layer on the thin metallic layer.

6 Claims, 2 Drawing Sheets

METHOD FOR TWO-DIMENSIONAL EPITAXIAL GROWTH OF III-V COMPOUND SEMICONDUCTORS

BACKGROUND OF THE INVENTION

The present invention relates to a method for growing a thin layer of III-V compound semiconductors on a GaAs substrate, and more particularly to a method for growing, on a GaAs substrate, a thin InGaAs or InAlAs layer with heavy lattice mismatching in two dimensions by a MOCVD (Metal Organic Chemical Vapor Deposition) process.

Currently, optical signals with a wavelength of 1.55 µm are used to process a fundamental signal in high speed data communication networks. As a thin film structure of an optical device, there are multiple thin layers of lattice matching, such as InGaAsP/InGaAs formed on an InP substrate. It is known that recently published multiple thin layers consisting of InAlGaAs/InGaAs have good optical properties, so one takes an interest in such thin layers. A demand for the development of a new device for processing a high speed, large capacity signal is ever increasing. For this, it is necessary to integrate optical and electronic devices and develop a new thin layer material and an optical fiber. In particular, with an increases in a use range, a multiple thin layer structure having a variety of energy band gaps in an active layer of a device is needed.

A technique for growing on a GaAs substrate multiple thin layers of heavy lattice mismatching, such as InAlAs or InGaAs, can freely adjust the energy band gap according to variation of an In composition. However, this technique has disadvantages such as the occurrence of high density dislocation due to the lattice mismatching, three-dimensional thin layer growth due to strain in an initial process for thin layer growth, and the like.

To overcome these shortcomings, a grading technique of the In composition has proposed. Refer to "Strain relaxation of compositionally graded $In_xGa_{1-x}As$ buffer layers for modulation-doped $In_{0.3}Ga_{0.7}As/In_{0.29}Al_{0.71}As$ heterostructures", J. C. P. Chang, Jianhui Chen, J. M. Fernandes, H. H. Wieder, and K. L. Kavanagh, Appl. Phys. Lett., 60, 1129(1992), and "Surfactant-mediated molecular-beam epitaxy of highly-strained III-V semiconductor heterostructures", E. Tournie, K. H. Ploog, N, Grandjean and J. Massies, Proc. of 6th Int. Conf. on Indium Phoshide and Related Materials Mar., 1994, p49.

In these techniques, a rapid variation in the strain can be minimized by gradually increasing the In composition during the thin layer growth, and the thin layer having the good surface can be grown by reducing the dislocation density. However, since stresses remain within the thin layer and a grading buffer layer becomes thick, it is difficult to apply these techniques to device fabrication.

SUMMARY OF THE INVENTION

It is therefore an object of the invention to provide a method for growing a thin layer having the good surface by two-dimensional growth rather than three-dimensional growth with cross-hatching pattern defects in growing a heterogeneous thin layer of a III-V compound semiconductor with heavy lattice mismatching on a GaAs substrate.

It is another object of the invention to provide a method for growing a thin layer of a III-V compound semiconductor which is capable of minimizing the occurrence of dislocation by completely relaxing lattices during initial epitaxial growth.

In accordance with one aspect of the invention, a thin metallic binary layer is inserted between two thin heterogeneous layers with a very different lattice constant. Thus, a lattice is completely relaxed during initial epitaxial growth of a III-V compound semiconductor. As a result, the dislocation density at the boundary surface of these heterogeneous layers is low and the dislocation effectively disappears as the thickness of the thin layer increases. By the insertion of the thin metallic layer, there is no great variation in electrical and optical properties, as well as multiple layer structure properties. Hence, a band gap can be freely adjusted and devices with a variety of properties fabricated.

The present invention is more specifically described in the following paragraphs by reference to the drawings attached only by way of example.

DETAILED DESCRIPTION OF THE PREFERRED EMBODIMENT

Figure 1:
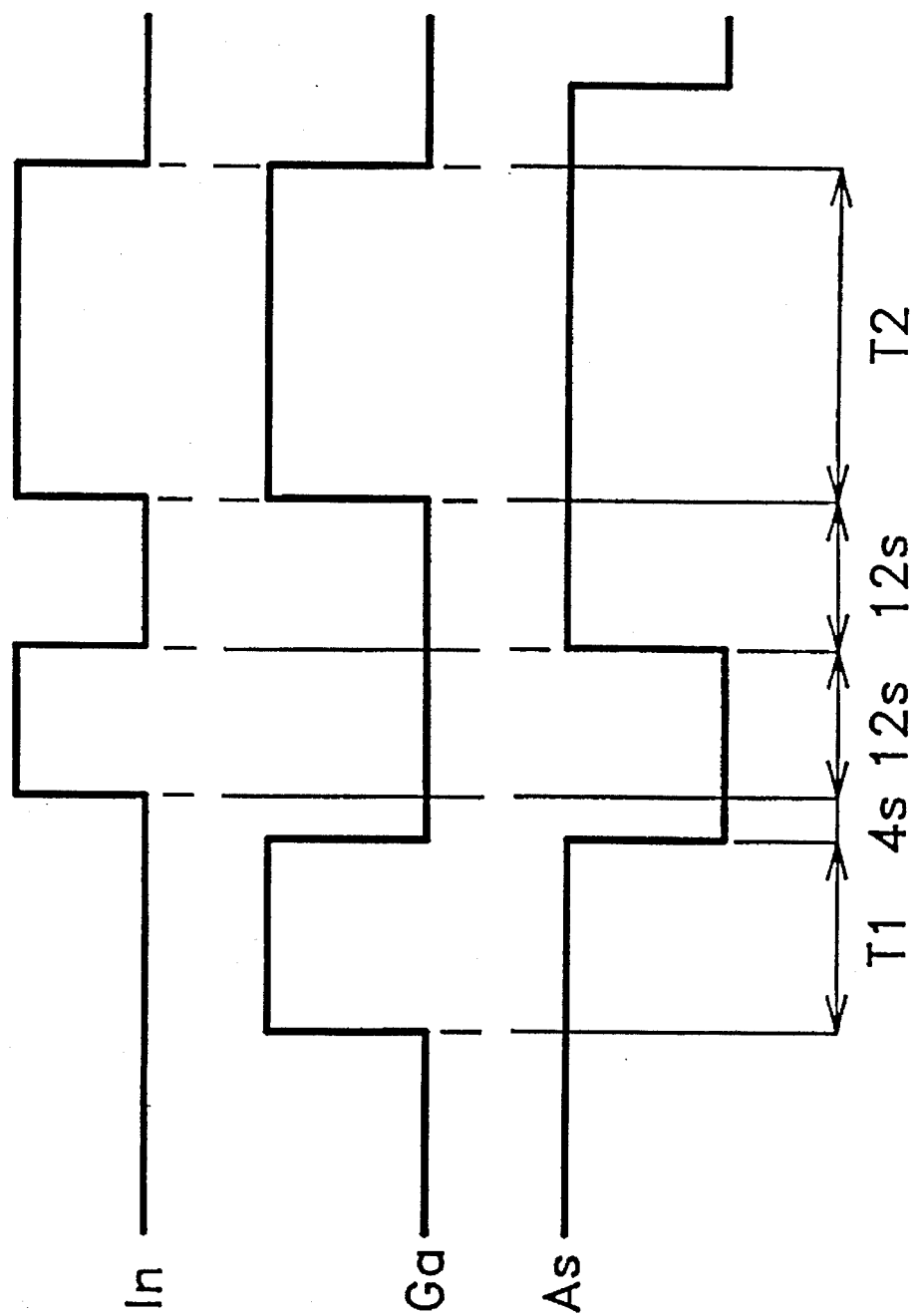
FIG. 1 is a chart showing the order of material gas injection versus time in a process of growing a thin $In_xGa_{1-x}As$ (x>0.5) layer with heavy lattice mismatching on a GaAs substrate by a MOCVD process according to the present invention.
Figure 2:
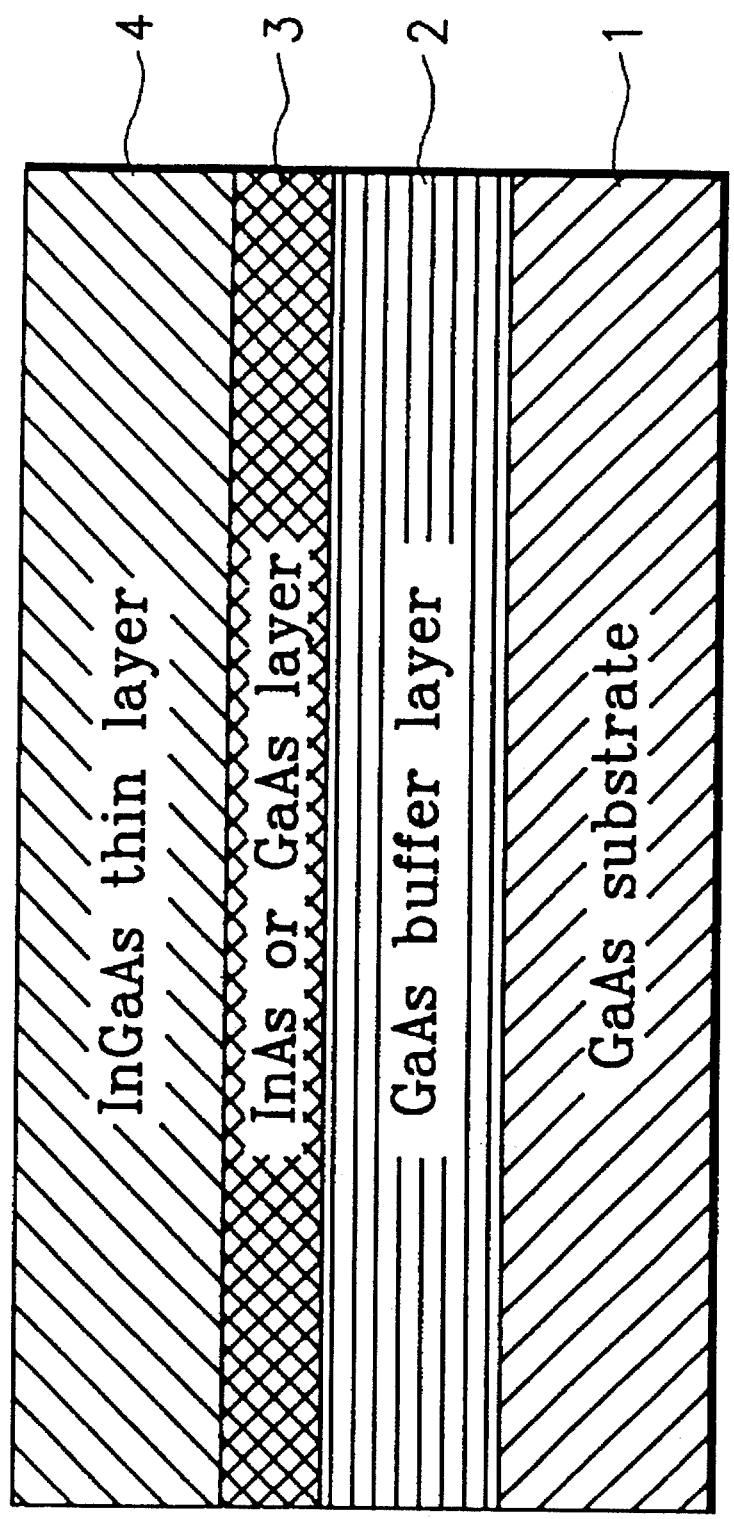
FIG. 2 is a diagram showing a thin layer structure grown by a process of FIG. 1.

Referring to FIGS. 1 and 2, a homogeneous GaAs buffer layer 2 is grown on a GaAs substrate 1 to a thickness of about 100 nm by supplying Ga and As gases for a prescribed time T1 by a MOCVD process. The buffer layer 2 is grown such that there is no defect and the flat surface with the roughness corresponding to the height of a signal atom layer is formed. After stopping the supply of the material gases for about 4 seconds, a material gas containing a column III element (In or Ga) is injected for about 12 seconds at a temperature of about 420 C. Thereafter, a material gas, preferably arsine $AsH_3$, containing a column V element (As) is injected to grow a thin binary layer 3 with metallic components of a high concentration (hereinafter abbreviated as a "thin metallic layer") containing the III element (In or Ga) to a thickness corresponding to a height overlapped with approximately 5–7 atoms, that is, to 2 nm or less thick. It takes 10 to 12 seconds to have that height from the injection of the arsine $AsH_3$ gas. The thin metallic layer 3 is a GaAs or InAs layer with the ratio of the column III and V elements grater than 1 and has rich metallic properties (especially at the boundary surface). The thin metallic layer 3 also has the mirror-like surface without a cross-hatching pattern, so the surface thereof is in the two-dimensional plane. After 10–12 seconds from the injection of the $AsH_3$ gas, In and Ga gases mixed in the prescribed ratio are injected at an atmosphere of the $AsH_3$ gas to grow a thin InGaAs layer 4.

The InGaAs layer 4 is relatively thicker than the thin metallic layer 3. If the strain of the InGaAs layer 4 increases, the strain increases only by the same amount as the strain of the thin metallic layer 3 formed under the InGaAs layer 4. This is because the dislocation easily occurs at the thin metallic layer 3 having unstable lattice arrangement and weak bond energy even if the thickness of the InGaAs layer 4 is thick.

Since the bond energy of lattices between the buffer layer 2 and thin metallic layer 3 is remarkably smaller than that of lattices between others due to lattice defects within the thin metallic layer 3, the stress caused by lattice mismatching relaxes along with the direction parallel to the boundary surface and thus the dislocation density concentrates only at the boundary surface between the buffer layer 2 and thin metallic layer 3. The stress efficiently disappears if the thickness of the buffer layer 2 and InGaAs layer 4 is thin. Consequently, when the InGaAs layer 4 is formed, the dislocation mainly occurs along with the bottom boundary surface of the thin metallic layer 3.

The present inventors observed a sample with the electron microscope, with the result that it was confirmed that the even and weak strain remains only at the very thin boundary surface under the thin metallic layer 3.

An example for growing another thin InAlAs layer of heavy lattice mismatching on the GaAs substrate will now be described.

As described above, the GaAs buffer layer 2 is grown on the GaAs substrate 1 and then the supply of a material gas is stopped for about 4 seconds. Thereafter, a material gas of a column III element (In or Al) is injected for about 12 seconds at a temperature of 500 C. Then the $AsH_3$ gas is injected and after a few seconds In and Al gases for growing the thin InAlAs layer are injected. The grown InAlAs layer has the high-quality, mirror-like surface without the cross-hatching pattern.

As may be apparent from the aforementioned description, the thin InGaAs and InAlAs layers having a band gap of a variety of long wavelength regions can be grown on the GaAs substrate having reasonable price, easy handling and large size relative to an InP substrate. Further, the dislocation due to lattice mismatching is minimized and the thin layer having the surface without the cross-hatching pattern is obtained. Since only the thin metallic layer is inserted to minimize the dislocation due to the lattice mismatching, a variation of the entire thin layer structure is minimized and electric or optical properties remain unchanged. Further, only the stable dislocation exists within the thin layer by efficiently eliminating the remaining stress during a growth process. According to a demand for the thin layer having various band gaps, the thin layer is easily inserted between junction structures (or multiple layer structures) and thus the range of device characteristics is greatly enlarged, in addition to forming the basis of the creation of a new device. The inventive method can be applicable to a GaAs layer growth technique using a silicon substrate.

While preferred embodiments of invention have been particularly shown and described, it will be understood by those skilled in the art that foregoing and other changes in form and details may be made without departing from the spirit and scope of the present invention.

What is claimed is:

1. A method for growing a thin layer of a III-V compound semiconductor, comprising the steps of:

injecting a first material gas by a MOCVD (Metal Organic Chemical Vapor Deposition) process to grow a homogeneous buffer layer on a GaAs substrate to a prescribed thickness;

stopping the injection of said first material gas for a first time, and injecting a second material gas containing a column III element for a second time at a prescribed temperature;

injecting a third material gas containing a column V element to grow, on said buffer layer, a thin metallic layer of a binary compound containing said column III element of a high concentration to a thickness of 2 nm or less; and after a third time from the injection of said third material gas, injecting indium (In) and gallium (Ga) gases mixed in the prescribed proportion in an atmosphere of said third material gas to grow a thin InGaAs layer on said thin metallic layer.

2. The method as claimed in claim 1, wherein said first, second and third times are 4, 12 and 12 seconds, respectively, and said prescribed temperature is about 420 C.

3. The method as claimed in claim 2, wherein said second material gas is indium (In) or gallium (Ga), and said third material gas is $AsH_3$.

4. A method for growing a thin layer of a III-V compound semiconductor, comprising the steps of:

injecting a first material gas by a MOCVD (Metal Organic Chemical Vapor Deposition) process to grow a homogeneous buffer layer on a GaAs substrate to a prescribed thickness;

stopping the injection of said first material gas for a first time, and injecting a second material gas containing a column III element for a second time at a prescribed temperature;

injecting a third material gas containing a column V element to grow, on said buffer layer, a thin metallic layer of a binary compound containing said column III element of a high concentration to a thickness of 2 nm or less; and after a third time from the injection of said third material gas, injecting indium (In) and aluminum (Al) gases mixed in the prescribed proportion in an atmosphere of said third material gas to grow a thin InAlAs layer on said thin metallic layer.

5. The method as claimed in claim 4, wherein said first, second and third times are 4, 12 and 12 seconds, respectively, and said prescribed temperature is about 500 C.

6. The method as claimed in claim 5, wherein said second material gas is indium (In) or gallium (Ga), and said third material gas is $AsH_3$.

* * * * *